(12) United States Patent
Shin et al.

(10) Patent No.: US 8,760,443 B2
(45) Date of Patent: Jun. 24, 2014

(54) LOW-LEAKAGE GATE LINES DRIVING CIRCUIT FOR DISPLAY DEVICE

(75) Inventors: Seob Shin, Seoul (KR); Yeong-Koo Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 310 days.

(21) Appl. No.: 13/398,726

(22) Filed: Feb. 16, 2012

(65) Prior Publication Data

US 2012/0146983 A1 Jun. 14, 2012

Related U.S. Application Data

(63) Continuation of application No. 11/862,951, filed on Sep. 27, 2007, now Pat. No. 8,120,598.

(30) Foreign Application Priority Data

Sep. 29, 2006 (KR) .................. 10-2006-0095981

(51) Int. Cl.
*G09G 5/00* (2006.01)

(52) U.S. Cl.
USPC ........................................... 345/204; 345/92

(58) Field of Classification Search
CPC ..... G09G 3/36; G09G 3/3611; G09G 3/3648; G09G 3/3659; G09G 3/3677; G09G 3/3688
USPC .................................... 345/87–102, 204–215
See application file for complete search history.

(56) References Cited

U.S. PATENT DOCUMENTS

| | | | |
|---|---|---|---|
| 6,690,347 B2 | 2/2004 | Jeon et al. | |
| 6,876,353 B2 | 4/2005 | Morosawa et al. | |
| 7,292,212 B2 | 11/2007 | Makishima et al. | |
| 7,692,620 B2 | 4/2010 | Horibata et al. | |
| 8,120,598 B2 * | 2/2012 | Shin et al. ..................... | 345/204 |
| 2006/0071923 A1 | 4/2006 | Lee et al. | |
| 2006/0221040 A1 | 10/2006 | Pak et al. | |
| 2006/0238482 A1 | 10/2006 | Jang et al. | |
| 2007/0075954 A1 | 4/2007 | Oh et al. | |
| 2008/0001899 A1 | 1/2008 | Chan et al. | |
| 2008/0273004 A1 | 11/2008 | Osame et al. | |
| 2010/0289780 A1 | 11/2010 | Chang et al. | |

FOREIGN PATENT DOCUMENTS

| | | |
|---|---|---|
| JP | 2001-160299 | 6/2001 |
| JP | 2004-524639 | 8/2004 |
| JP | 2006-106320 | 4/2006 |
| JP | 2006-120308 | 5/2006 |
| KR | 2002-0066962 | 8/2002 |

(Continued)

OTHER PUBLICATIONS

English language Abstract for WO 02/065062 (corresponding to Japanese Publication 2004-524639).

*Primary Examiner* — Vijay Shankar
(74) *Attorney, Agent, or Firm* — Innovation Counsel LLP (57) ABSTRACT

A gates-line driving circuit of a display device includes a plurality of stages that are serially connected to each other, where each stage includes a plurality of transistors and a plurality of capacitors and receives a scanning start signal, a plurality of clock signals, and first and second gate-off voltages Voff1 and Voff2 of different magnitudes, where some of the transistors are turned off with the first gate-off voltage, and others of the transistors are turned off with the second gate-off voltage.

7 Claims, 7 Drawing Sheets

(56) References Cited

FOREIGN PATENT DOCUMENTS

| | | |
|---|---|---|
| KR | 2003-0079569 | 10/2003 |
| KR | 10-2004-0070537 | 8/2004 |
| KR | 10-2005-0037657 | 4/2005 |
| KR | 10-2005-0068176 | 7/2005 |
| KR | 10-2005-0114850 | 12/2005 |
| KR | 10-2005-0121357 | 12/2005 |
| KR | 10-2006-0051997 | 5/2006 |
| KR | 10-2006-0097819 | 9/2006 |
| WO | 02/065062 A2 | 8/2002 |
| WO | 02/065062 A3 | 8/2002 |

* cited by examiner

LOW-LEAKAGE GATE LINES DRIVING CIRCUIT FOR DISPLAY DEVICE

CROSS-REFERENCE TO RELATED APPLICATION

This application is a continuation application of U.S. patent application Ser. No. 11/862,951 filed on Sep. 27, 2007 now U.S. Pat. No. 8,120,598, which claims priority to and benefit of Korean Patent Application No. 10-2006-0095981 filed in the Korean Intellectual Property Office on Sep. 29, 2006, the entire disclosure of the prior applications being incorporated herein by reference.

BACKGROUND (a) Field of Invention

The present disclosure of invention relates to driving circuitry of a display device.

(b) Description of Related Art

In recent years, as a substitute for heavy and large cathode ray tubes (CRTs), flat panel displays, such as organic light emitting diode (OLED) displays, plasma display panels (PDPs), and liquid crystal displays (LCDs) have been actively developed.

The PDP is a device that can display characters and/or images by using a light-emitting plasma that is generated according to selective activation of a gas discharge. The OLED displays characters and/or images by using selective activation of field emission effects of particular organic materials or polymers. In the LCD, an electrical field is selectively applied to a liquid crystal layer interposed between two display panels, and transmittance of light passing through the liquid crystal layer is controlled by controlling strength of the electrical field to thus obtain a desired image.

So-called thin-film versions of these display devices (e.g. the LCD) include a display panel including a matrix of pixel units each having a switching element and a portion of a display signal line and a portion of a gate signal line passing through the pixel unit; where the latter gate signal line is driven by a multi-lines gate driver circuit that transmits gate-on voltage levels and gate-off voltage levels to selected ones of plural gate lines of the display in order to respectively turn on/off the corresponding switching elements of pixel units in selected display rows. A data driver is further provided to transmit data voltages to the data lines of the display so that the data voltages are applied to pixel-electrodes of the pixel units through the turned-on switching elements of a given display row.

In addition, in small and medium-sized display devices, there is a case where the gate driver is integrally formed on the display substrate using the same fabrication process as that used for the switching element in order to save costs in a large-sized display device.

The gate-lines driver typically includes a plurality of gate-line driving stages. The stages are often in a form where they combine to define a shift register that is arranged in a line adjacent to ends of rows of the pixel matrix. A moving row-select token or carry-signal is generated to move down the shift register and down the rows of the pixel matrix so as to select one row at a time. For example, a first shift stage transmits a logic "1" carry output signal to a next shift stage and so on, thereby sequentially generating a gate-activating output pulse, where the gate output pulse is synchronized to a scanning start signal.

In one class of embodiments, each shift register stage includes a plurality of MOSFET transistors, and some transistors among the plurality of transistors are operated to have same voltages at a gate and a source thereof when it is desired to turn the MOSFET off (render it nonconductive). However, even in such a case the amount of leakage current that flows through the supposedly-turned off transistor can be a significant amount for some specific applications. Accordingly, when excess leakage current flows, it may not be possible to maintain a desired constant voltage at the point where the leaking transistor is present and an output terminal controlled by the leaking transistor may not be appropriately operated, and the display screen may have a problem as a result.

SUMMARY

The present disclosure of invention provides a gate-lines driving apparatus for a display device where the driving apparatus exhibits reduced leakage current and increased reliability.

An exemplary driving apparatus according to the present disclosure includes a plurality of stages connected to each other. Each stage includes a plurality of transistors and capacitors, and each stage receives a scanning start signal, a plurality of clock signals, and first and second gate-off voltages Voff1 and Voff2 of different magnitudes. Some of the transistors are turned off by the first gate-off voltage, and others are turned off by the second gate-off voltage.

In one embodiment, the second gate-off voltage ($V_{off\text{-}2}$) is substantially lower than the first gate-off voltage ($V_{off\text{-}1}$), for example by about 5 volts.

In addition, each stage includes a set terminal (s), a reset terminal (R), first and second gate voltage terminals, an output terminal, and first and second clock terminals.

The plurality of transistors and capacitors include a first transistor, a second transistor, a third transistor, a fourth terminal, a fifth transistor, a sixth transistor, a seventh transistor, a first capacitor, and a second capacitor. The first transistor is connected between the first clock terminal and the output terminal and includes a control terminal connected to a first node. The second transistor includes control and input terminals commonly connected to the set terminal and an output terminal connected to the first node. The third transistor is connected between the first node and the second gate voltage terminal and includes a control terminal connected to the reset terminal. The fourth terminal is connected between the first node and the second gate voltage terminal and includes a control terminal connected to a second node. The fifth transistor is connected between the output terminal and the first gate voltage terminal and includes a control terminal connected to the second node. The sixth transistor is connected between the output terminal and the first gate voltage terminal and includes a control terminal connected to the second clock terminal. The seventh transistor is connected between the second node and the first gate voltage terminal and includes a control terminal connected to the first node. The first capacitor is connected between the first clock terminal and the second node. The second capacitor is connected between the first node and the output terminal.

In this case, the first gate-off voltage may be input to the first gate voltage terminal, and the second gate-off voltage may be input to the second gate voltage terminal.

Here, the second gate-off voltage may be lower than the first gate-off voltage, and for example, the first gate-off voltage may be −10V and the second gate-off voltage may be −15V.

In addition, the stage may be integrated with the display device.

BRIEF DESCRIPTION OF THE DRAWINGS

The accompanying drawings briefly described below illustrate exemplary embodiments in accordance with the present disclosure and, together with the description, serve to explain operating principles thereof.

DETAILED DESCRIPTION

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
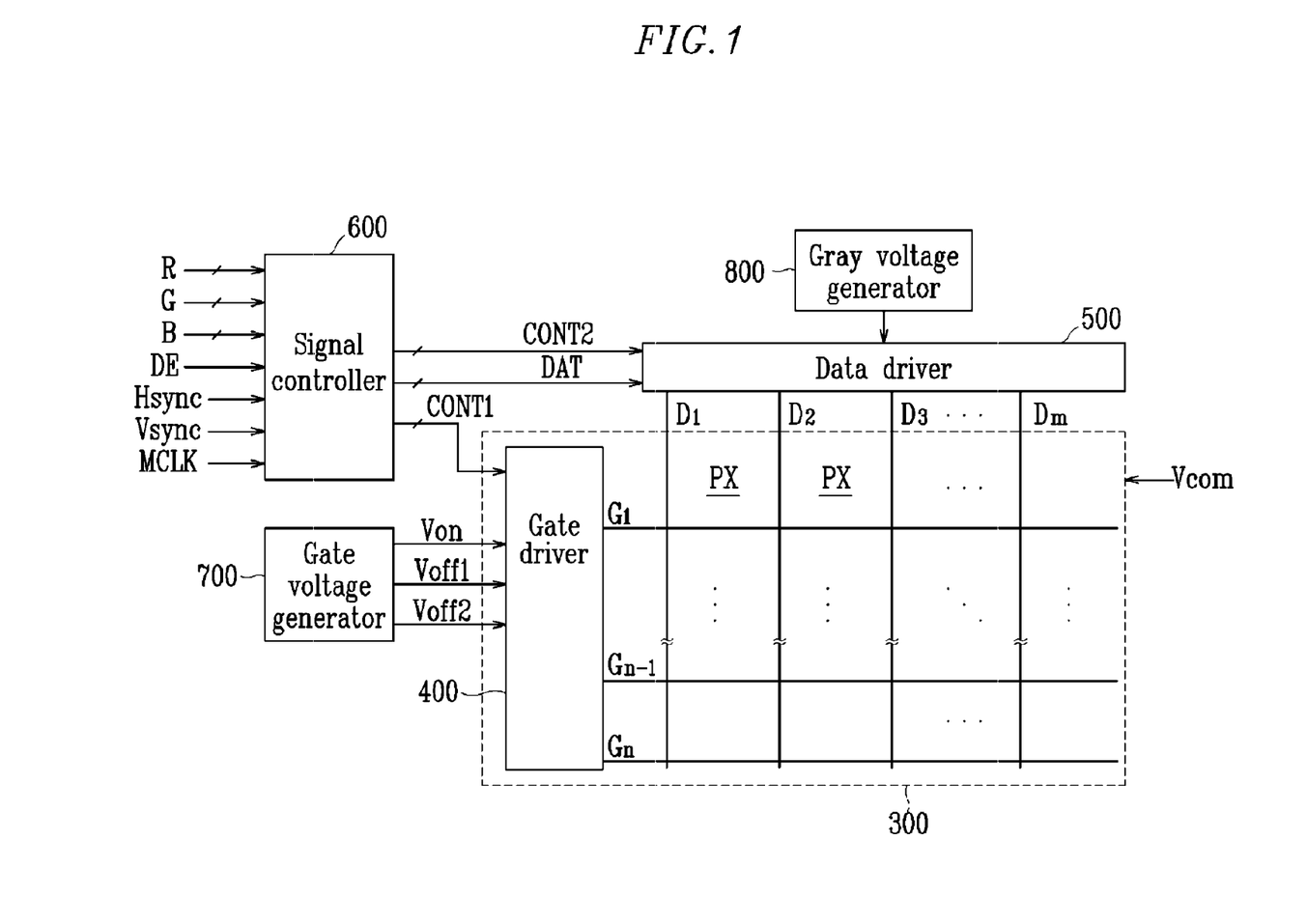
FIG. 1 is a block diagram of a liquid crystal display (LCD) according to an exemplary embodiment.
Figure 2:
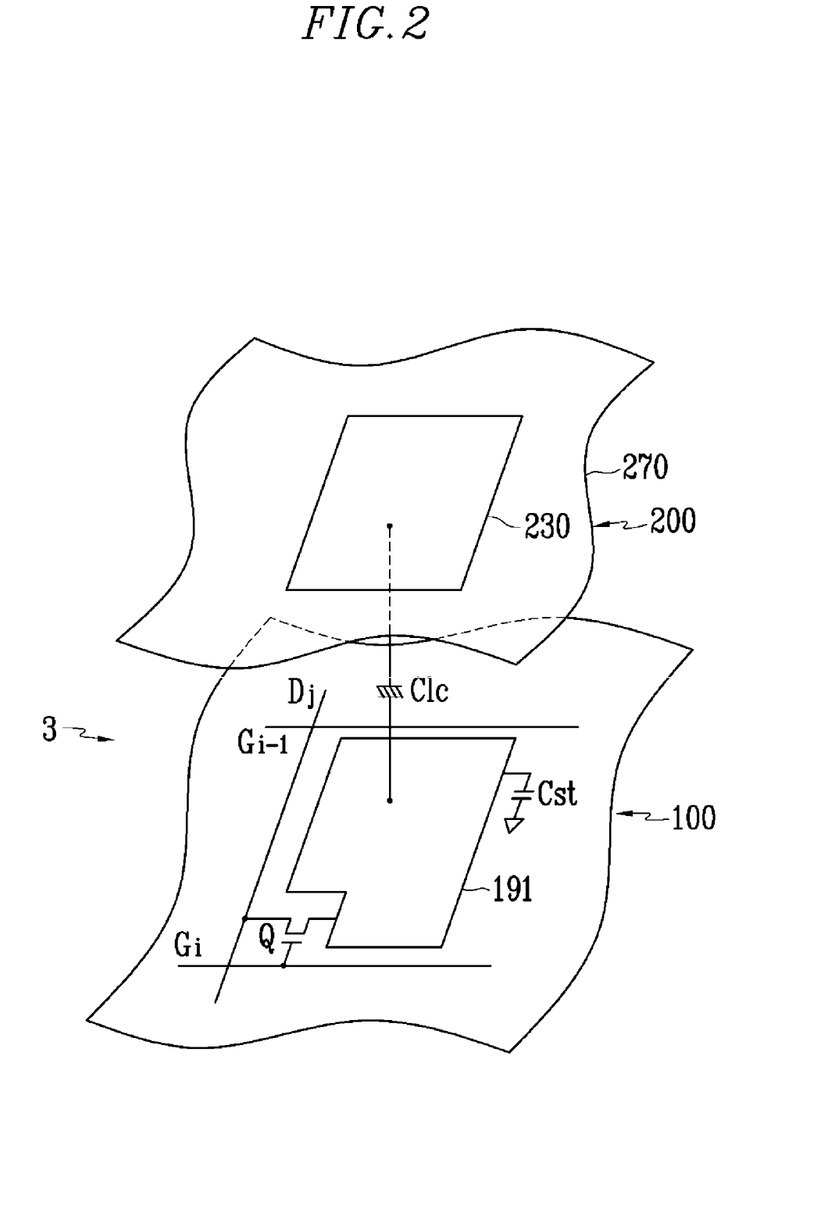
FIG. 2 is an equivalent circuit diagram for a single pixel of the LCD according to the exemplary embodiment.

FIG. 1 is a block diagram of a liquid crystal display (LCD) including drive electronics according to the exemplary embodiment. FIG. 2 is an equivalent circuit diagram for a single pixel unit of the LCD according to the exemplary embodiment.

As shown in FIG. 1, the LCD according to the exemplary embodiment includes a liquid crystal panel assembly 300, a gate-lines driver 400 and a data-lines driver 500 that are connected to respective gate and data lines of the liquid crystal panel assembly 300. In the illustrated embodiment, a gate voltages generator 700 connects to the gate driver 400, a gray voltages generator 800 connects to the data driver 500, and a signal controller 600 couples to both of units 400 and 500 for controlling them.

In terms of an equivalent circuit, the liquid crystal panel assembly 300 may be viewed as having a plurality of gate signal lines, $G_1$ to $G_n$, a plurality of data signal lines, $D_1$ to $D_m$ crossing with the gate signal lines, and a plurality of pixels PX formed at the intersections and connecting to corresponding ones of the plurality of signal lines $G_1$ to $G_n$ and $D_1$ to $D_m$ and arranged substantially in a matrix. In terms of the structure as shown in FIG. 2, the liquid crystal panel assembly 300 includes lower and upper panels 100 and 200 and a liquid crystal layer 3 interposed therebetween.

As mentioned, the signal lines include a plurality of gate lines, $G_1$ to $G_n$ for transferring gate signals (also referred to as scan signals) to corresponding ones of the pixels, PX and a plurality of data lines $D_1$ to $D_m$ for transferring data signals to corresponding ones of the pixels, PX. In one embodiment, the gate lines $G_1$ to $G_n$ extend substantially in a horizontal row direction and are substantially parallel to each other, while the data lines $D_1$ to $D_m$ extend substantially in a column or vertical direction and are substantially parallel to each other.

As better shown in FIG. 2, each pixel PX, i.e., a pixel PX connected with the i-th (i=1, 2, ..., n) gate line $G_i$ and the j-th (j=1, 2, ..., m) data line $D_j$, may be considered as including a switching element Q connected with adjacent portions of the signal lines $G_i$ and $D_j$, and a liquid crystal capacitor Clc and a storage capacitor Cst connected thereto. The storage capacitor Cst can be omitted if desired.

The switching element Q may be a three-terminal switching element such as a thin film MOSFET transistor (TFT) provided on the lower panel 100, where the TFT includes a control terminal (gate) connected with the gate line $G_i$, an input terminal (source) connected with the data line $D_j$, and an output terminal (drain) connected with the liquid crystal capacitor Clc and the storage capacitor Cst.

Plates of the liquid crystal capacitor Clc may be defined by a pixel electrode 191 disposed in the lower panel 100 and a portion of a common electrode 270 disposed in the upper panel 200 with the liquid crystal material layer 3 being interposed between the two plates 191 and 270 to serve as a dielectric material. The pixel electrode 191 is connected with the switching element Q, and the common electrode 270 is formed on the entire surface of the upper panel 200 and receives a common voltage, Vcom. In an alternate embodiment from the case as shown in FIG. 2, the common electrode 270 can be provided on the lower panel 100, and in this case, at least one of the two plates 191 and 270 can be formed in a linear or bar or stripe shape.

The storage capacitor Cst that serves as an auxiliary to the liquid crystal capacitor Clc has one plate formed as a separate signal line (not shown) provided on the lower panel 100 and the pixel electrode 191 overlapping it with an insulator interposed therebetween, and a predetermined voltage such as the common voltage Vcom or the like being applied to the separate signal line. Also, the storage capacitor Cst can be formed as the pixel electrode 191 overlaps the immediately previous gate line by the medium of the insulator.

In order to implement a color display, each pixel PX may have a color filter associated with it for specifically displaying, for example one of the primary colors (spatial division) like Red, Green and Blue (RGB) or in some displays the pixels PX may be controlled to alternately display primary or other colors over time (temporal division), so that a desired color can be recognized by the spatial and/or temporal sum of the primary colors. FIG. 2 shows one example of the spatial division variety in which each pixel PX includes a color filter 230 that displays one of the primary colors at a region of the upper panel 200 corresponding to the pixel electrode 191. Different from the color filter 230 as shown in FIG. 2, the color filter 230 can be formed above or below the pixel electrode 191 of the lower panel 100.

At least one polarizer (not shown) for polarizing light is typically attached on an outer surface of the liquid crystal panel assembly 300.

Referring back to FIG. 1, the gray voltages generator 800 typically generates two sets of opposite polarity gray voltages (or in some cases two sets of reference gray voltages which are then extrapolated amongst) where the generated voltages relate to different levels of light transmittance of the pixels PX. One of the two sets of the gray voltages is usually comprised of voltage levels having positive values only and the other of only negative values with respect to the common voltage Vcom.

Figure 4:
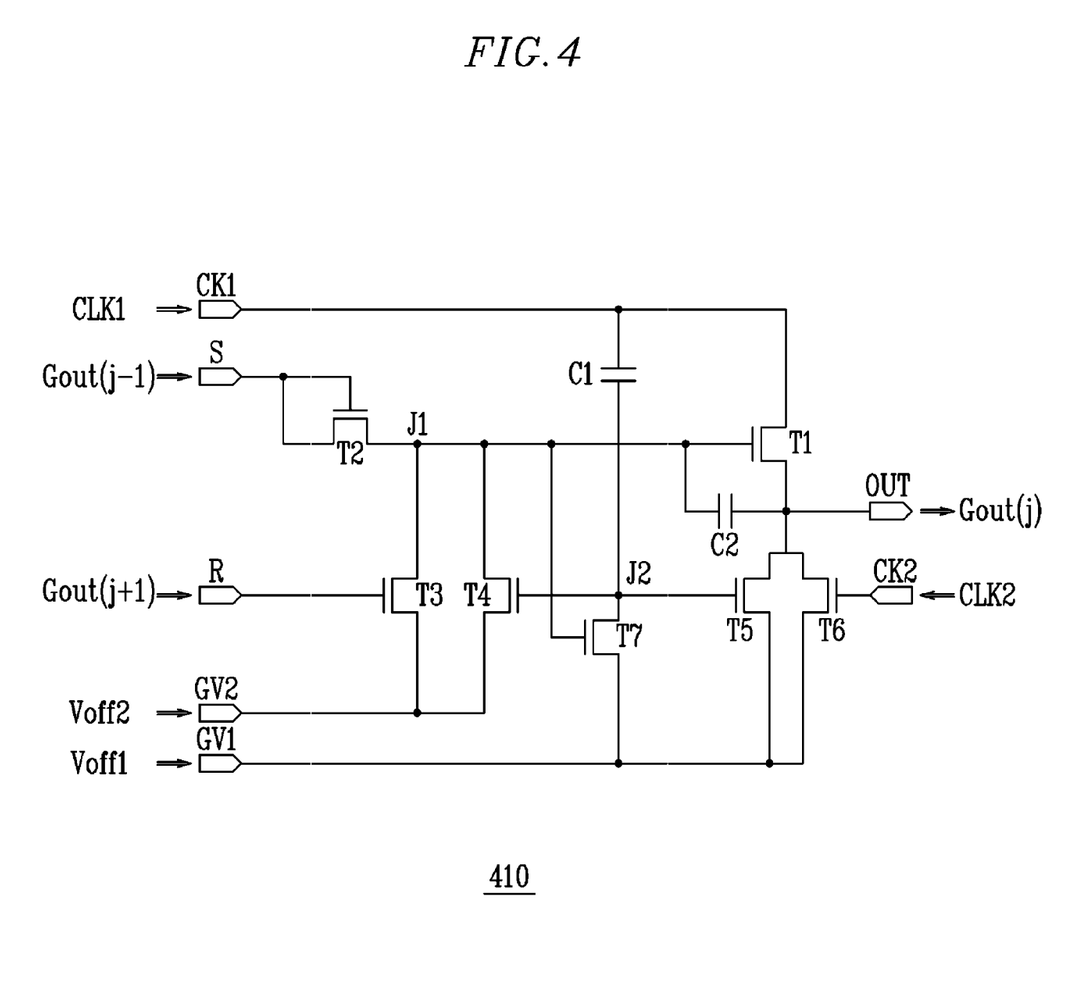
FIG. 4 is a circuit diagram illustrating a j-th stage of a shift register for the gate driver shown in FIG. 3.

In the illustrated embodiment, the gate voltage generator 700 generates one gate-on voltage level, Von and at least two different gate-off voltages, Voff1 and Voff2 that are to be selectively applied to the gates of one or more transistors within the gate-lines driver 400 (e.g., to the gate of T1 in FIG. 4).

The gate driver 400 is integrated with the liquid crystal panel assembly 300, and is connected to the gate lines $G_1$ to $G_n$ to apply selected gate signal levels selected from among the voltage levels generated by the gate voltage generator 700 to the gate lines $G_1$ to $G_n$. Here, the gate signal is formed by combinations over time of the gate-on voltage level, Von the first gate-off voltage level, $V_{off\text{-}1}$ and the second gate-off voltage level, $V_{off\text{-}2}$.

The data driver 500 is connected to the data lines $D_1$ to $D_m$ of the LC panel assembly 300, and selects gray voltages from the gray voltage generator 800 to apply the selected gray voltages to the data lines $D_1$ to $D_m$ as data signals. However, in a case where the gray voltage generator 800 does not provide respective voltages for all gray scales but only provides a predetermined number of reference gray voltages, the data driver 500 divides (extrapolates among) the reference gray voltages to generate gray voltages for all the gray scales and selects a data signal from among them.

The signal controller 600 controls the gate driver 400 and the data driver 500.

Each of the drivers 500, 600, 700, and 800, excepting the gate driver 400, may be directly mounted as at least one integrated circuit (IC) chip on the liquid crystal panel assembly 300 or on a flexible printed circuit film (not shown) in a tape carrier package (TCP) type, which are attached to the liquid crystal panel assembly 300, or may be mounted on an additional printed circuit board (not shown). Alternately, the drivers 500, 600, 700, and 800 may be integrated with the panel assembly 300 along with the signal lines $G_1$ to $G_n$ and $D_1$ to $D_m$ and the TFT switching elements Q. Further, the drivers 500, 600, 700, and 800 may be integrated as a single chip. In this case, at least one of them or at least one circuit device constituting them may be located outside the single chip.

An operation of the liquid crystal display will now be described.

The signal controller 600 receives digitized input image signals R, G, and B and input control signals for controlling the display thereof from an external graphics controller (not shown). The input control signals may include a vertical synchronization signal Vsync, a horizontal synchronization signal Hsync, a main clock signal MCLK, and a data enable signal DE.

After generating gate control signals CONT1 and data control signals CONT2 and processing the image signals R, G, and B to be suitable for the operation of the panel assembly 300 on the basis of the input control signals and the input image signals R, G, and B, the signal controller 600 provides the gate control signals CONT1 for the gate driver 400, and the processed image signals DAT and the data control signals CONT2 for the data driver 500.

The gate control signals CONT1 include vertical scanning start signals STV1 and STV2 for instructing the start of scanning of different rows and at least one clock signal CLK1 and CLK2 for controlling the output start time of a gate-on voltage pulse, Von. The gate control signals CONT1 may further include an output enable signal OE for defining the duration of the gate-on voltage pulse, Von.

The data control signals CONT2 include a horizontal synchronization start signal STH for informing of start of data transmission for a row (or a group) of pixels, a load signal LOAD for instructing to apply the data signals to the data lines $D_1$-$D_m$, and a data clock signal HCLK. The data control signal CONT2 may further include an inversion signal RVS for inverting the polarity of the voltages of the data signals with respect to the common voltage Vcom (hereinafter also, "the polarity of the voltages of the data signals with respect to the common voltage" which may be abbreviated as "the polarity of the data signals").

In response to the data control signals CONT2 from the signal controller 600, the data driver 500 receives digital image signals DAT for a row (or a group) of pixels from the signal controller 600, converts the digital image signals DAT into analog data signals by selecting gray voltages corresponding to the respective digital image signals DAT, and applies the digital image signals DAT to the data lines $D_1$ to $D_m$.

The gate driver 400 applies the gate-on voltage Von to the gate lines $G_1$ to $G_n$ in response to the gate control signals CONT1 from the signal controller 600, thereby turning on the switching elements Q connected thereto. The data voltages applied to the data lines $D_1$ to $D_m$ are supplied to the pixels through the turned-on switching elements Q.

A difference between the voltage of the data signals applied to a pixel PX and the common voltage Vcom appears as a charged voltage of the LC capacitor Clc, i.e., a pixel voltage. The liquid crystal molecules have orientations depending on magnitude of the pixel voltage to change the polarization of light passing through the liquid crystal layer 3. The change of the polarization is converted into change of the light transmittance by the polarizer attached to the liquid crystal panel assembly 300.

The above operation is repeatedly performed over a single horizontal scan period, 1H corresponding to one period of the horizontal synchronization signal Hsync and the data enable signal DE, the gate-on voltage Von is sequentially applied to all the gate lines $G_1$ to $G_n$ one after the other, and the data voltage is applied to all the pixels to thus display an image of one frame.

After one frame ends, a subsequent frame is started, and a state of the inversion signal RVS applied to the data driver 500 to invert the polarity of the data voltage applied to each pixel PX from the polarity in a previous frame is controlled, which is referred to as a "per-frame inversion". In this case, in one frame, the polarity of the data voltage flowing through one data line may be periodically changed according to characteristics of the inversion signal RVS (e.g., row inversion and dot inversion), or the polarities of the data voltage applied to one pixel row may be different (e.g., column inversion and dot inversion).

The driving apparatus of the display device according to the exemplary embodiment will now be described with reference to FIG. 3 to FIG. 7.

Figure 3:
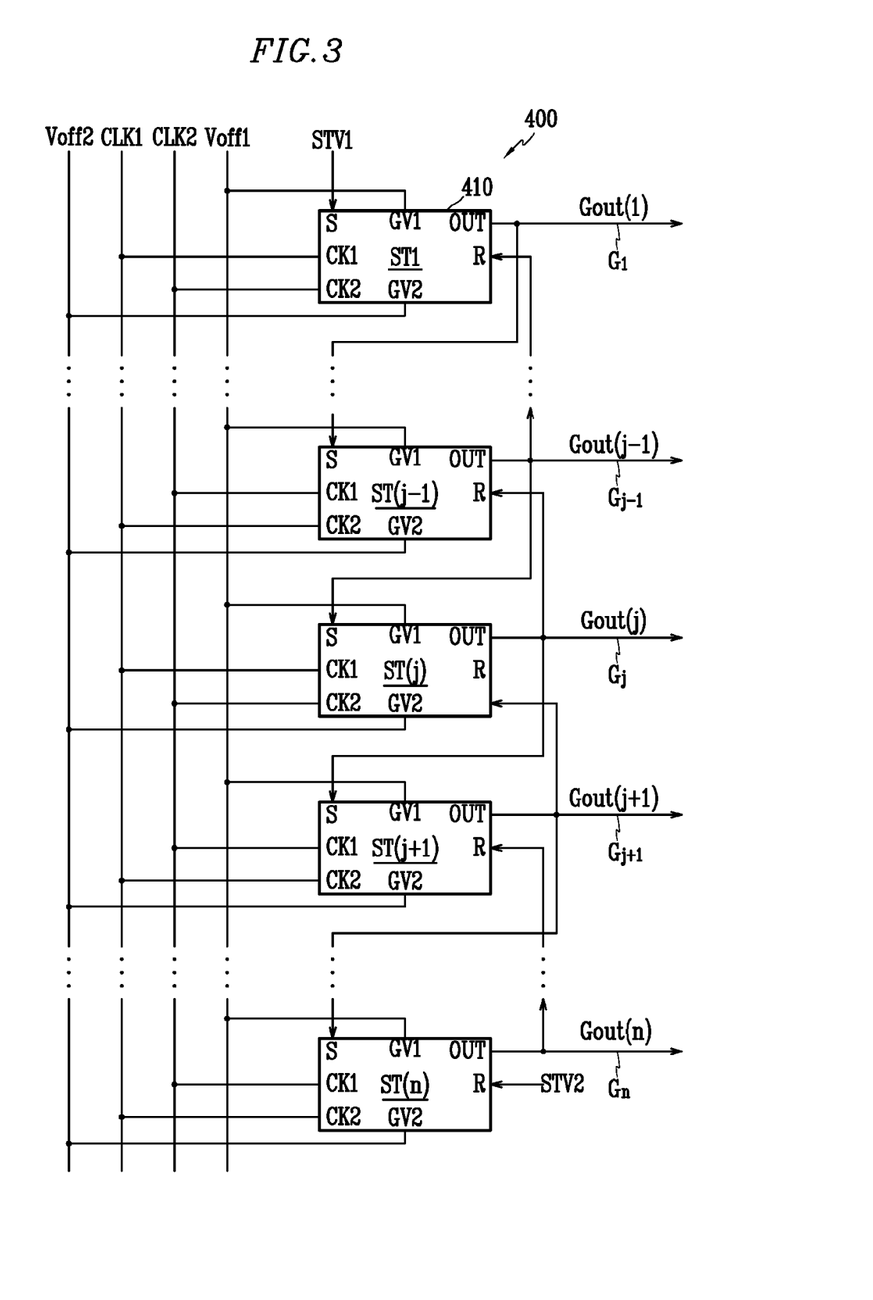
FIG. 3 is a block diagram of the gate driver according to the exemplary embodiment.
Figure 5:
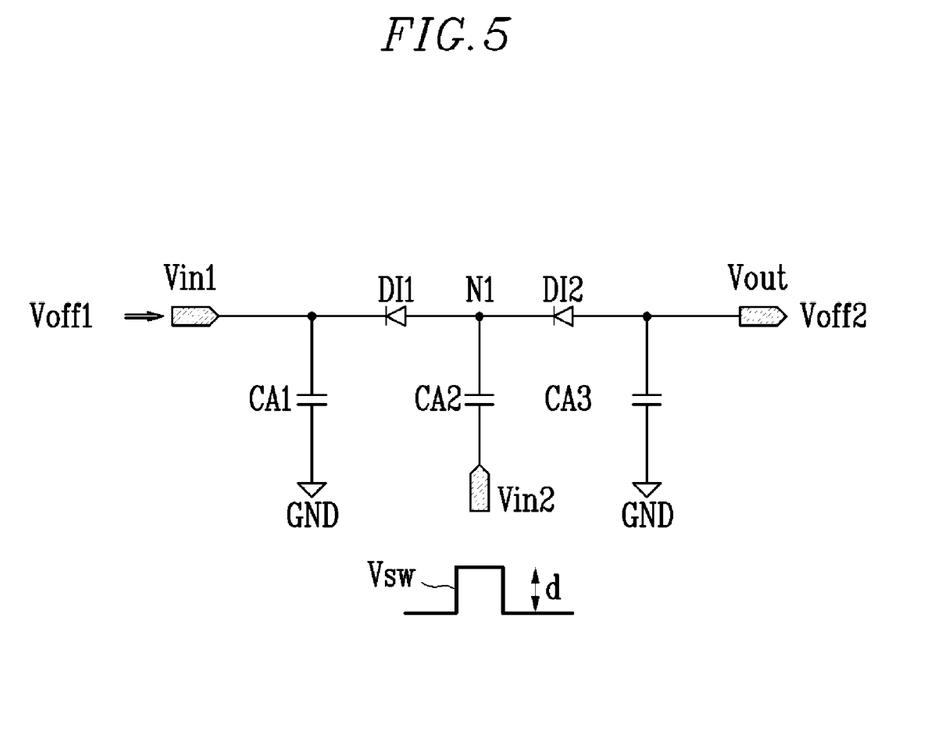
FIG. 5 shows a circuit diagram of a circuit for generating a second gate off voltage from a first gate off voltage in the gate driver according to the exemplary embodiment and a signal waveform diagram representing a switching signal input to the circuit.
Figure 6:
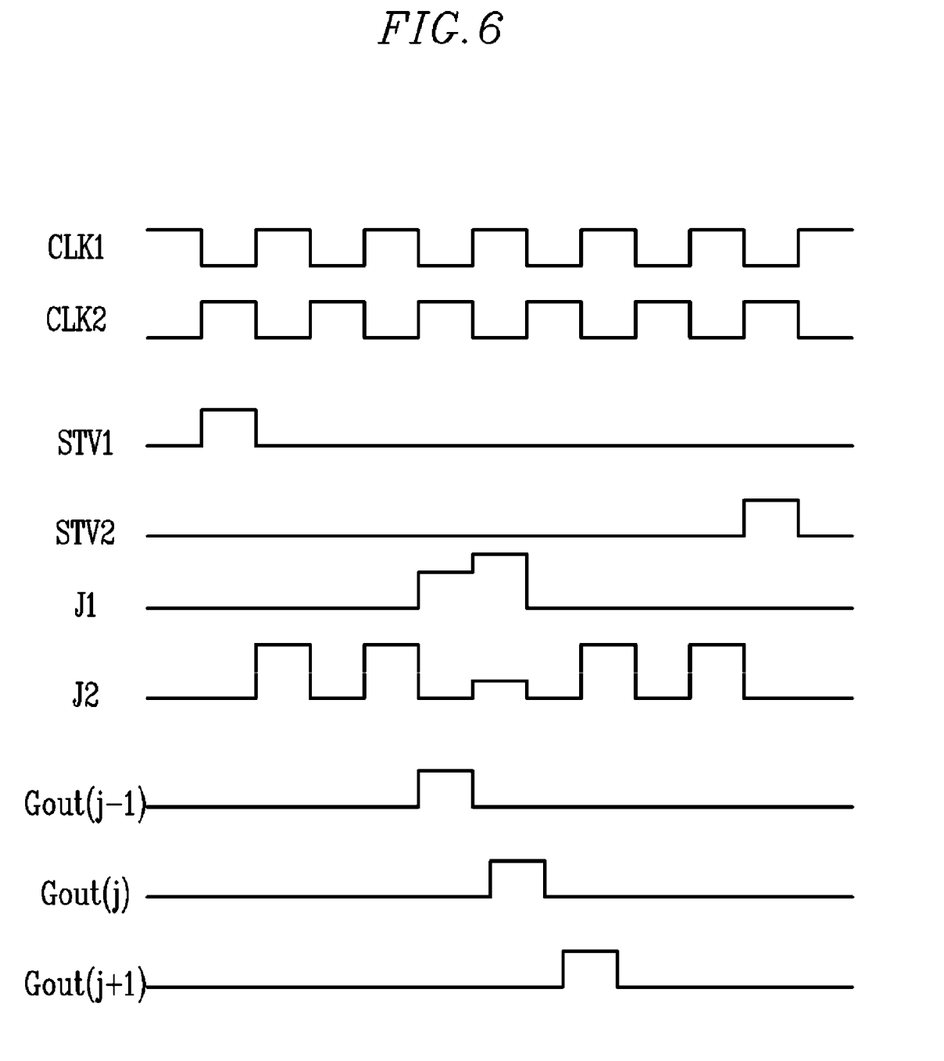
FIG. 6 is a signal waveform diagram of the gate driver shown in FIG. 3.
Figure 7:
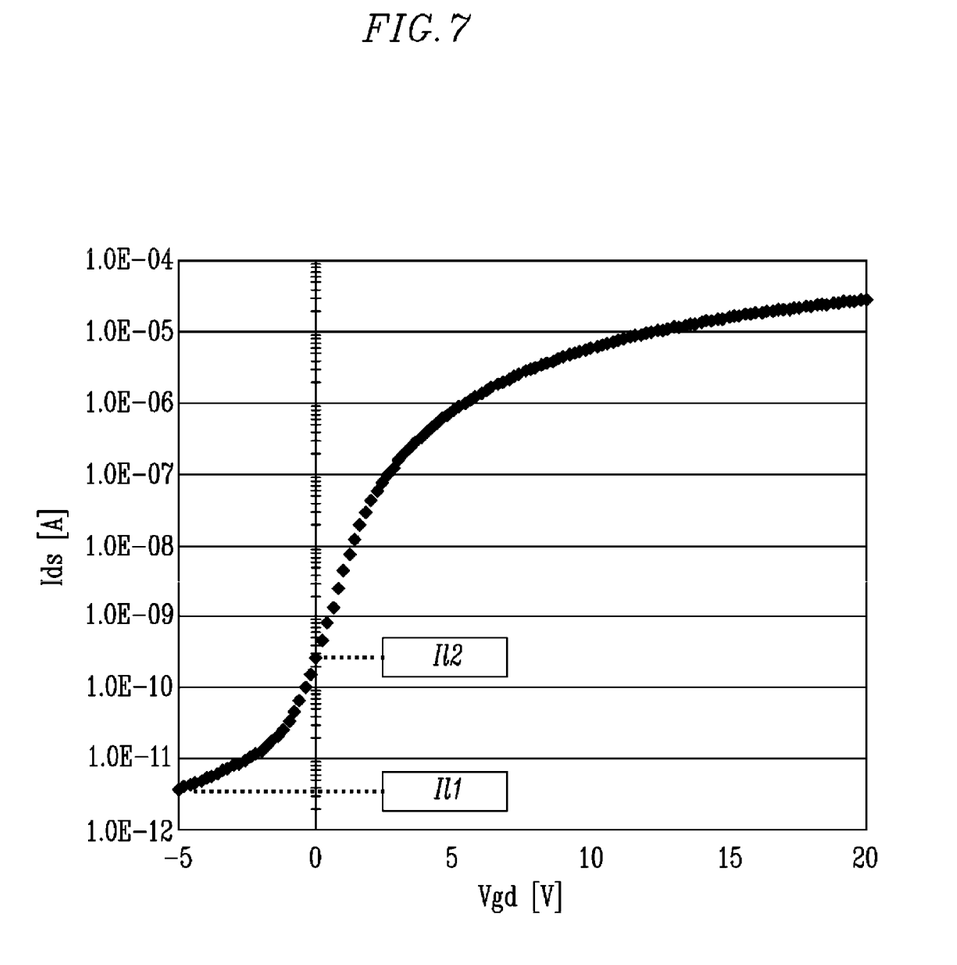
FIG. 7 is a graph comparing leakage current characteristics of transistors forming the gate driver shown in FIG. 3.

FIG. 3 is a block diagram of the gate-lines driver according to the exemplary embodiment. FIG. 4 is a circuit diagram illustrating a j-th stage of the gate driver shown in FIG. 3. FIG. 5 shows a circuit diagram of a circuit for generating a second gate off voltage from a first gate off voltage in the gate driver according to the exemplary embodiment and a signal waveform diagram representing a switching signal input to the circuit. FIG. 6 is a signal waveform versus time diagram of the gate driver shown in FIG. 3. FIG. 7 is a graph comparing leakage current characteristics of a transistor T7 in the gate driver shown in FIG. 3 when that transistor is turned off by one gate-off voltage as opposed to a second gate-off voltage.

For better comprehension and ease of description, it is assumed that a voltage corresponding to a high level of the clock signals CLK1 and CLK2 is the same as the gate-on voltage Von and is referred to as a high voltage (logic "1"). In addition, among voltages corresponding to a first low level thereof (logic "0a"), a voltage that is the same as the first gate-off voltage Voff1 will be referred to as a first low voltage. A voltage that is the same as the different, second gate-off voltage Voff2 will be referred to as a second low voltage. In one embodiment, the first gate-off voltage Voff1 is substantially higher than the second gate-off voltage Voff2 when both are compared relative to Vcom. That is, the second low voltage is lower than the first low voltage (Voff2<Voff1).

The gate driver circuit 400 shown in FIG. 3 functions as a shift register including a plurality of stages 410 that are connected to the gate lines $G_1$ to $G_n$, and the scanning start signals STV1 and STV2, the clock signals CLK1 and CLK2, and the first and second gate-off voltages Voff1 and Voff2 are input to the gate driver 400 for application to GV1 and GV2 terminals of the respective stages 410.

Each stage 410 includes a set terminal S, a reset terminal R, first and second gate voltage receiving terminals GV1 and GV2, an output terminal OUT, and clock terminals CK1 and CK2.

In each stage 410, for example a gate output of a previous stage ST(j−1) (i.e., a previous-stage gate output signal Gout (j−1)), is input to the set terminal S of a j-th stage STj. A gate output of a next stage ST(j+1) (i.e., a next-stage gate output signal Gout(j+1)) is input to the reset terminal R of the j-th stage STj. The clock signals CLK1 and CLK2 are input to the clock terminals CK1 and CK2. The output terminal OUT outputs a corresponding gate output Gout(j) to the jth gate line $G_j$ of the display, and also to the previous and next stages ST(j−1) and ST(j+1). Although not shown, an additional output terminal may be provided for outputting a carry signal to the previous and next stages ST(j−1) and ST(j+1) and a buffer connected to the output terminal OUT may also be provided.

It is understood that each stage 410 is synchronized with the clock signals CLK1 and CLK2 and cooperates interoperatively with the previous gate output Gout(j−1) and the next gate output Gout(j+1) so that when a scanning pulse passes through (see the bottom three waveforms of FIG. 6) only one will be substantially turned on at a time.

The first start-of-scanning signal STV1 is input to the Set terminal (S) of a first stage ST1 of the shift register 400 and the second start-of-scanning signal STV2 is input to the Reset terminal (R) of a last stage ST(n). The first and second scanning start pulses STV1 and STV2 respectively have a width of 1H, and are respectively input at the beginning and end of each frame (i.e., they respectively have a 1 frame cycle).

The clock signals CLK1 and CLK2 respectively have a duty ratio of 50% and a 2H period, and they sequentially have a phase difference of 180°.

In this case, for example when the clock signal CLK1 is input to the clock terminal CK1 of the j-th stage ST(j) and the clock signal CLK2 is input to the clock terminal CK2, the clock signal CLK2 is input to the clock terminals CK1 of the neighboring (j−1)-th and (j+1)-th stages ST(j−1) and ST(j+1), and the clock signal CLK1 is input to the clock terminal CK2.

As shown in FIG. 4, each stage of the gate driver 400 according to the exemplary embodiment, for example the j-th stage, includes n-channel metal oxide semiconductor (NMOS) transistors T1 to T7 and capacitors C1 and C2. However, p-channel metal oxide semiconductor (PMOS) transistors may be used with appropriate circuit adjustments rather than using the illustrated NMOS transistors T1-T7. In one embodiment, capacitors C1 and C2 are substantially defined by parasitic capacitances such as formed between an insulated gate layer (e.g., polysilicon) and a drain/source layer formed in the manufacturing process. The T1 output transistor is referred to in this detailed description as the first transistor.

Second transistor T2 includes control and input terminals that are diode connected to the set terminal S, for unidirectionally transmitting the previous gate row output signal Gout (j−1) to a first circuit node J1 in the illustrated stage 410.

The third transistor T3 includes a control terminal connected to the reset terminal R, and it couples the second gate-off voltage Voff2 to the node J1 when turned on.

Control terminals of the fourth transistor T4 and the fifth transistor T5 are commonly connected to a second circuit node J2. The fourth transistor T4 transmits the second gate-off voltage Voff2 to the node J1 when turned on, and the fifth transistor T5 transmits the first gate-off voltage Voff1 to the output terminal OUT when turned on.

The sixth transistor T6 is connected to the clock terminal CK2. The seventh transistor T7 has its gate connected to the first node J1. The sixth and seventh transistors, T6 and T7, respectively transmit the first gate-off voltage Voff1 to the second node J2 and to the output terminal OUT when turned on.

The first transistor T1 includes a control terminal connected to the first node J1, and transmits (passes) the clock signal CLK1 to the output terminal OUT when turned on. Although pass transistors are described throughout, transmission gates may be used if desired.

The first capacitor C1 is connected between the clock terminal CK1 and the second node J2. The second capacitor C2 is connected between the first node J1 and the output terminal OUT.

An operation for generating the second gate off voltage Voff2 from the first gate off voltage Voff1 in the shift register shown in FIG. 4 will now be described with reference to FIG. 5.

As shown in FIG. 5, a second gate off voltage generation circuit according to the exemplary embodiment includes a first input terminal Vin1, an output terminal Vout, and a first diode DI1 and a second diode DI2 that are connected in series between the first input terminal Vin1 and the output terminal Vout.

The first gate off voltage Voff1 is input to the first input terminal Vin1.

A first capacitor A1 is connected between the first input terminal Vin1 and the first diode DI1. One electrode of the first capacitor CA1 is connected to a cathode of the first diode DI1, and another electrode of the first capacitor CA1 is grounded.

A second capacitor CA2 is connected between the first diode DI1 and the second diode DI2. One electrode of the second capacitor CA2 is connected to a node N1 between an anode of the first diode DI1 and a cathode of the second diode DI2, and another electrode of the second capacitor CA2 is connected to a second input terminal Vin2. A switching signal Vsw is input to the second input terminal Vin2. The switching signal Vsw is a pulse signal, an amplitude d of one pulse is the same as a difference between the first gate off voltage Voff1 and the second gate off voltage Voff2, and the second gate off voltage Voff2 is less than the first gate off voltage Voff1.

A third capacitor CA3 is connected between the second diode DI2 and the output terminal Vout. One electrode of the third capacitor CA3 is connected to an anode of the second diode DI2, and another electrode of the third capacitor CA3 is grounded.

When the first gate off voltage Voff1 is applied to the first input terminal Vin1 and the switching signal Vsw is input to the second input terminal Vin2, a square wave having the first gate off voltage Voff1 as a high level and the second gate off voltage Voff2 (i.e., a value that is lower than the first gate off voltage Voff1 by d) as a low level flows through the node N1. Subsequently, the square wave is rectified through the second diode DI2, and the second gate off voltage that is lower than the first gate off voltage Voff1 by d is output to the output terminal Voff2.

In this case, the first capacitor CA1 stabilizes the first gate off voltage Voff1, and the second capacitor CA2 transmits the switching signal Vsw to the node N1, and the third capacitor CA3 stabilizes the second gate off voltage Voff2.

As described, the first gate off voltage Voff1 is used to generated the second gate off voltage Voff2 that is lower than the first gate off voltage Voff1. However, a method for generating the second gate off voltage Voff2 is not limited to the above circuit, and various exemplary embodiments may be adopted.

Operation of the j-th stage will now be exemplified to describe an operation of the shift register shown in FIG. 4. This will be done in four phases. In the first phase, CLK1 is low and the previous row, Gout(j−1) is high. In the second phase, CLK1 goes high and the previous row, Gout(j−1) switches to low. In the third phase, CLK1 goes low again and the next row, Gout(j+1) goes high. In the fourth phase, CLK1 goes high again and the next row, Gout(j+1) switches to low. See the corresponding three time slots of FIG. 6 where the three successive gate signals go high: Gout(j−1), Gout(j), Gout(j+1) and the time slot thereafter where all are low.

In FIG. 4, the j-th stage ST(j) is synchronized with the first clock signal CLK1 to generate a Von pulse at its gate output Gout(j) when CLK1 is high and the previous and next stages ST(j−1) and ST(j+1) are synchronized with the second clock signal CLK2 to generate corresponding Von pulses at their respective gate outputs (Gout(j−1) and Gout(j+1)) when CLK2 is high.

At the start of the first operational phase of stage 410, when the second clock signal CLK2 and the previous gate output Gout(j−1) become high levels, the transistors T2 and T6 in the illustrated Jth stage of FIG. 4 are turned on. Thereby, the second transistor T2 (the diode-connected transistor) transmits a high voltage to the first node J1 to thereby send gate-turn-on voltages to the gates of the two transistors, T1 and T7 and to also charge the second capacitor C2 to a Vgs level that can keep T1 turned on. The first transistor T1 does not supply a high output to the OUT terminal at this time though because at the same time (the first phase), the CLK1 signal has been switched to low. The switching of the CLK1 signal to low causes the second node J2 to be driven toward a low voltage via the combination of a voltage stored on capacitor C1 and the CLK1 signal having switched to low. (It will be appreciated later that maintenance of the given voltage across first capacitor C1 is important in order to assure that voltage on second node J2 rises and falls as desired. See the J2 waveform of FIG. 6.) Moreover, because in this first phase, the first node J1 has been switched to high (via T2), the seventh transistor T7 is turned on to thereby couple the first low voltage level on line GV1 to the second node J2 and to thereby drive J2 low at this time. The sixth transistor T6 also transmits the first low voltage level on line GV1 to the output terminal OUT (where T6 is conductive because CLK2 is high at this time). In addition, as already mentioned, the first transistor T1 is turned on (due to J1 being high) and the currently low level of the clock signal CLK1 is thereby coupled to the output terminal OUT by way of the T1 drain-to-source path. In this first phase, since the clock signal CLK1 is in the first low voltage state, the gate output signal Gout(j) is maintained in the first low voltage while the previous stage output Gout(j−1) is maintained in the high state. Note again that the second capacitor C2 was simultaneously charged with a voltage corresponding to the difference between the high voltage on node J1 (Gout (j−1) minus the drop across T2) and the first low voltage (Voff1) on the OUT terminal.

Still referring to the first phase, since the next gate output Gout(j+1) is in a low level, the input level of the reset terminal R is also currently in the low level. Accordingly, the third through fifth transistors T3, T4, and T5 including the control terminals connected to the reset terminal R and the second node J2 are turned off.

Subsequently upon entering phase two, when the first clock signal CLK1 now switches to high and the second clock signal CLK2 simultaneously switches to low, the transistors T5 and T6 are turned off. Accordingly, coupling of the output terminal OUT to the first gate-off voltage Voff1 is interrupted and coupling is initiated of the output terminal OUT being connected to the switched-high first clock signal CLK1, this causing the high Von voltage to be output as the gate output signal Gout(j). Note in this case that diode-connected T2 prevents the second capacitor C2 from discharging into the going-low Gout(j−1) signal. Second capacitor C2 thus remains charged with a voltage corresponding to the earlier difference between the high voltage on J1 and the first low voltage on the OUT terminal and C2 continues to apply this turn-on voltage ($V_{GSon}$) between the gate and source of first transistor T1. However, since the OUT terminal voltage has bumped up at this time, the absolute voltage on node J1 bumps up also (see the upward bump in the J1 waveform of FIG. 6) because the voltage on node J1 equals that on the OUT terminal plus the voltage across C2. The high voltage on J1 increases the conduction by T7 and the turned on seventh transistor T7 allows the first capacitor C1 (i.e., whose bottom connects to second node J2) to be charge by the high voltage presented by the going high, CLK1 clock signal minus the voltage drop across T7; this meaning that the bottom plate of C1 is more negative than its top plate by that voltage difference ($V_{on} - V_{dsT7}$). See the subdued value of J2 in FIG. 6 for this second phase.

Then, as the third phase begins, the next gate output signal Gout(j+1) becomes high, the third transistor T3 is turned on and transmits the second low voltage on line GV2 to the first node J1 for the purpose of rapidly discharging C2 and rapidly turning first transistor T1 off. Recall that the second low voltage is lower than the first low voltage (Voff2<Voff1). Accordingly, the first transistor T1 is rapidly turned off, the connection of the first clock signal CLK1 to the Jth output terminal OUT is thus interrupted and the potential for C1 discharging through a combination of a turned-on T1 and a turned-on T5, T6, T7 is reduced because at least T1 and T7 are strongly turned off by application of the lower Voff2 turn-off voltage to their gates.

Simultaneously, since the clock signal CLK2 switches high in phase 3, the sixth transistor T6 is turned on, the output terminal OUT is connected to the first gate-off voltage Voff1 by way of T6, and therefore the output terminal OUT switches to outputting the first low voltage. In addition, since the second node J2 is floated when the transistor T7 is rapidly and strongly turned off by the coupling of node J1 to the lower Voff2 voltage via T3, the node J2 is driven low by the going low CLK1 signal and the negative drop added to it by the voltage stored on C1. In other words, since the control terminal (gate) of the seventh transistor T7 is connected to the rapidly discharged node J1, the input terminal (source) thereof is connected to the first gate-off voltage Voff1, and thus the relative gate-to-source voltage ($V_{gdT7}$) of T7 has a negative value during phase three, T7 is driven heavily into cutoff and the low voltage on second node J2 is preserved.

Accordingly, as shown in FIG. 7 showing I-V characteristics of the seventh transistor (T7), the leakage current is considerably reduced by application of the negative gate-to-source voltage ($V_{gdT7}$) developed for T7. That is, the drain-to-source leakage current through T7 is considerably reduced in this case where the second gate-off voltage Voff2 (which is lower than the first gate-off voltage Voff1), is coupled via T3 to node J1 as opposed to a hypothetical alternate case where transistor T3 is connected to the first gate-off voltage (Voff1, connection not shown).

For example, when the first gate-off voltage Voff1 is −10V and the second gate-off voltage Voff2 is a lower value such as −15V (about five volts lower), FIG. 7 shows that a corresponding leakage current Il1 according to the exemplary embodiment is reduced by about two orders of magnitude (hundred times) relative to a conventional leakage current Il2 that would be see if the gate of T7 had instead been coupled to Voff1. Since the above leakage current tends to flow from the output terminal (drain) of the seventh transistor T7 (i.e., the node J2) to its input terminal (source), change of potential on supposedly floating node J2 is considerably reduced by reducing the leakage current through transistor T7. Accordingly, since the potential of the node J2 is prevented from being increased, the fourth and fifth transistors, T4 and T5 are kept assuredly turned off at this time and do not add flicker to the image being currently displayed over the frame period.

When the circuit transitions into a fourth phase where the next gate output Gout(j+1) goes low and the second clock signal CLK2 also switches to the low level, T3 and T6 turn off. However, in this case, since a terminal of the capacitor C1 is connected to the clock signal CLK1 which is going high, the potential of the floated node J2 switches high by the same amount according to the level of the clock signal CLK1 and T4 and T5 now turn on. T4 preserves the deep cut-off of T7 while the turned on T5 preserves the low level (Voff1) at the OUT terminal.

In a next frame, when the output terminal OUT becomes the high voltage again (i.e., the clock signal CLK1 is the high level in this next occurrence of phase two), J2 is low (subdued) through action of C1 to keep the output terminal disconnected from the first gate-off voltage Voff1 through the transistor T5. Later in the next third phase, the OUT terminal will be connected to the first gate-off voltage Voff1 through the transistor T6 when the clock signal CLK2 is the high level.

In the above method, since the gate output is generated from the first stage ST1 to the last stage ST(n) and the scanning start signal STV2 is input to the reset terminal R of the last stage ST(n), an operation of one frame is finished.

As described, since the transistors T3 and T4 are connected to the second gate-off voltage Voff2 that is lower than the first gate-off voltage Voff1 and the voltage (Vgs) between the gate and the drain of the transistor T7 is set to be a negative value, the leakage current of the node J2 may be substantially reduced. Accordingly, the two transistors T4 and T5 are appropriately operated, and the screen is prevented from being inappropriately displayed.

While an exemplary embodiment has been described, it is to be understood that the disclosure is not limited to the disclosed embodiment, but, on the contrary, is intended to cover various modifications and equivalent arrangements included within the spirit and scope of the teachings presented here.

The claims in this application are different from those of the application(s) from which priority is claimed. Applicant rescinds any disclaimer of claim scope made in the related application(s) and requests that any previous disclaimer and previously cited references be revisited. Further, any disclaimer made in the instant application is not intended to be read into the predecessor application(s).

What is claimed is:

1. A driving apparatus of a display device comprising a plurality of stages connected to each other, wherein one of the plurality of stages comprises:
    an output terminal for outputting a gate output signal;
    a first transistor providing the gate output signal to the output terminal, wherein the first transistor is connected to a clock terminal and includes a gate terminal connected to a first node;
    a first signal line transmitting a first gate-off voltage, electrically connected to a second node;
    a second signal line transmitting a second gate-off voltage, electrically connected to the first node;
    a second transistor providing the second gate-off voltage to the first node, wherein the second transistor is connected to the second signal line and includes a gate terminal connected to the second node;
    a third transistor providing the first gate-off voltage to the second node, wherein the third transistor is connected to the first signal line and includes a gate terminal connected to the first node.

2. The driving apparatus of claim 1,
    wherein the stage further comprises a fourth transistor providing the second gate-off voltage to the first node, connected to the second signal line and includes a gate terminal connected to a reset terminal.

3. The driving apparatus of claim 2,
    wherein the reset terminal provides a next stage gate output signal to the gate terminal of the fourth transistor.

4. The driving apparatus of claim 1, wherein the second gate-off voltage is lower than the first gate-off voltage.

5. The driving apparatus of claim 4, wherein
    the stage further comprises a first gate voltage terminal for inputting the first gate-off voltage and a second gate voltage terminal for inputting the second gate-off voltage.

6. The driving apparatus of claim 5, wherein
    the stage further comprises a set terminal for inputting a previous-stage gate output signal, and first and second clock terminals for inputting first and second clock signals, respectively.

7. The driving apparatus of claim 6, wherein the stage is integrated in the display device.

* * * * *